US009762223B2

(12) United States Patent
Magnoni

(10) Patent No.: US 9,762,223 B2
(45) Date of Patent: Sep. 12, 2017

(54) CIRCUIT AND METHOD FOR GENERATION OF A CLOCK SIGNAL WITH DUTY-CYCLE ADJUSTMENT

(71) Applicant: STMICROELECTRONICS S.R.L., Agrate Brianza (IT)

(72) Inventor: Davide Magnoni, Varese (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/156,162

(22) Filed: May 16, 2016

(65) Prior Publication Data
US 2017/0187365 A1   Jun. 29, 2017

(30) Foreign Application Priority Data
Dec. 23, 2015   (IT) .................. 102015000087463

(51) Int. Cl.
H03K 5/15   (2006.01)
H03K 5/156   (2006.01)
H03K 3/033   (2006.01)

(52) U.S. Cl.
CPC ........... *H03K 5/1565* (2013.01); *H03K 3/033* (2013.01)

(58) Field of Classification Search
CPC .......... H03K 3/033; H03K 3/355; H03K 3/38; H03K 5/13; H03K 5/133; H03K 3/3037
USPC ................................ 327/172, 173, 174, 175
See application file for complete search history.

(56) References Cited

U.S. PATENT DOCUMENTS

| 4,479,216 A | 10/1984 | Krambeck et al. |
| 4,599,736 A | 7/1986 | Hoppe |
| 6,060,922 A * | 5/2000 | Chow .................. H03K 5/1565 |
| | | 327/175 |
| 8,884,676 B2 | 11/2014 | Wong |

FOREIGN PATENT DOCUMENTS

| DE | 29 25 310 A1 | 1/1981 |
| JP | 07 212 195 | 8/1995 |
| WO | 84/02621 | 7/1984 |

OTHER PUBLICATIONS

Lanyon, H. P. D., "One-shot with feedback loop maintains constant duty cycle," XP-001700188, Electronics, Jul. 24, 1975, pp. 93-95.
Tajizadegan, R. et al., "A Duty-Cycle Control Circuit With High Input-Output Duty-Cycle Range," 15th International Conference, MIXDES 2008, Poland; 3 pgs.

(Continued)

*Primary Examiner* — John Poos
(74) *Attorney, Agent, or Firm* — Seed Intellectual Property Law Group LLP

(57) ABSTRACT

A clock-signal generator circuit, for generating an output clock signal starting from an input clock signal, includes: a monostable stage having a clock input configured to receive the input clock signal, a control input configured to receive a control signal, and an output configured to supply the output clock signal having a duty cycle variable as a function of the control signal; and a feedback loop, operatively coupled to the monostable stage for generating the control signal as a function of a detected value, and of a desired value, of the duty cycle of the output clock signal.

19 Claims, 4 Drawing Sheets

(56) References Cited

OTHER PUBLICATIONS

Tuwanut, P. et al., "A Novel Monostable Multivibrator Circuit," TENCON 2005 IEEE Region 10, Nov. 2005, Melbourne, Qld., 4 pgs.

Zhang, H. et al., "High-speed Programmable Counter Design for PLL Based on A Delay Division Technique," 2009 IEEE International Symposium on Radio-Frequency Integration Technology; 4 pgs.

* cited by examiner

CIRCUIT AND METHOD FOR GENERATION OF A CLOCK SIGNAL WITH DUTY-CYCLE ADJUSTMENT

BACKGROUND

Technical Field

The present disclosure relates to a circuit and to a method for generation of a clock signal, with the possibility of adjustment of the duty cycle.

Description of the Related Art

As it is known, clock signals are used for timing the operations of a large number of circuits, both analog and digital.

As illustrated in FIG. 1, a clock signal ck typically has a square-wave pattern with a given period T. The duty cycle d represents, in a known way, the active percentage of time of the period, designated by τ in FIG. 1, with respect to the total period:

$$d = \frac{\tau}{T}$$

In the digital field, the clock signals may, for instance, be used for synchronizing the operations of data communication. It is, for example, important to know the duration of the "high" and "low" levels of the clock signal in order to guarantee the so-called "setup" and "hold" times in combinatory logic, i.e., the minimum times required for a datum to remain stable before and after an edge, for example the rising edge, of the clock signal.

In the analog field, clock signals are used, for example, in switched-capacitor amplifier circuits, in which the presence of two phases is typically required, a "high" phase and a "low" phase, of appropriate duration, represented by the "high" level and "low" level of the clock signal. For instance, these phases may be used for timing operations of reset, or detection of an analog input signal. Given a certain period of the clock signal, the durations of the high and low phases must be selected appropriately, sometimes differing from one another to guarantee proper operation and settling of the circuit.

A large number of solutions have been proposed for generation of clock signals, having an adjustable duty cycle. The present Applicant has, however, found that none of these solutions is altogether satisfactory in terms, for example, of complexity and electric-power consumption.

For instance, a possible known solution is illustrated in FIG. 2 and is described in detail in the document: "High-speed Programmable Counter Design for PLL Based on A Delay Division Technique", Hui Zhang, Hai-gang Yang, Jia Zhang, Fei Liu—2009 IEEE International Symposium on Radio-Frequency Integration Technology.

According to this solution, a clock-signal generator circuit 1 envisages the use of an input clock signal, so-called "master", designated by $ck_{in}$, which has a high frequency and is supplied at the input of an n-bit digital counter 2.

The counter signal count generated by the digital counter 2 is supplied at the input of a first digital comparator 3 and of a second digital comparator 4, which compare it with a first threshold value M and a second threshold value N, respectively.

The output of the first digital comparator 3 is used as set signal S for an output flip-flop 5, whereas the output of the second digital comparator 4 is used as reset signal R for the same output flip-flop 5. The set signal S is further used for resetting the counter count supplied by the digital counter 2.

The output Q of the output flip-flop 5 provides the output clock signal $ck_{out}$, the duty cycle of which and the period of which may be regulated by selecting the appropriate threshold values M and N (which regulate, respectively, the high phase and the low phase of the clock signal). In particular, the duty cycle is in this case a function of the ratio N/M between the aforesaid threshold values.

The present Applicant has, however, realized that the clock-signal generator circuit 1, illustrated in FIG. 2, has some disadvantages, amongst which: a master clock signal $ck_{in}$ is required having a high frequency for accurate adjustment of the value of duty cycle; the resolution that may be obtained for the duty cycle depends upon the number of bits n of the digital counter 2; a high resolution requires a greater occupation of area in integrated implementation and a greater power consumption; it is possible to obtain only a certain number of discrete values for adjustment of the duty cycle.

A further known solution for a clock-signal generator circuit 1' is illustrated in FIG. 3 and described in detail in the document: "A Duty-Cycle Control Circuit With High Input-Output Duty-Cycle Range", R. Tajizadegan, A. Abrishamifar—15th International Conference, MIXDES 2008, Poland.

This further solution is based in general on a delay-locked loop (DLL), which envisages the use of a delay line 6, receiving an input clock signal, once again designated by $ck_{in}$, and formed by a chain of a certain number p of delay logic gates 7, with variable and adjustable delay, connected together in series. The output of this chain of delay logic gates 7 is closed in a loop feedback path towards the input.

The phase difference between the input clock signal $ck_{in}$ and the output clock signal $ck_{out}$ (given by the cumulative delay of the various delay logic gates 7) is zero or known in steady-state conditions, owing to the presence of a phase-frequency detector (PFD) 8, which measures the phase offset of the voltages across the chain and controls, through a biasing generator 9, the delay of the individual delay logic gates 7, via application of an appropriate control signal.

The voltages on the output of each delay logic gate 7 represent respective divisions of the input clock signal $ck_{in}$.

The present Applicant has realized that also this further solution has some disadvantages, amongst which the following: the resolution that may be obtained for the duty cycle depends on the length of the delay line 6, so that a greater resolution requires a greater number p of delay logic gates 7 (and a consequent increase in occupation of area and electric power consumption); the DLL is based on the precise coupling between the various delay logic gates 7, so that the use of a large number of such delay logic gates 7 (to obtain a high resolution) exposes to problems of linearity; also in this case, it is possible to obtain only a certain number of discrete values for the duty cycle.

BRIEF SUMMARY

The present disclosure provides various embodiments, including circuits and methods for generating a clock signal, that overcome, at least in part, the aforesaid problems and disadvantages, and in particular that provide a solution for generation of a clock signal with variable and adjustable duty cycle, which will be more economically advantageous, and less expensive in terms of occupation of area and electric-power consumption.

BRIEF DESCRIPTION OF THE SEVERAL VIEWS OF THE DRAWINGS

For a better understanding of the present disclosure, preferred embodiments are now described, purely by way of non-limiting example and with reference to the attached drawings, wherein.

DETAILED DESCRIPTION

As will be described in detail hereinafter, an aspect of the present solution envisages the use, for generation of a clock signal with adjustable duty cycle, of a signal-controlled monostable circuit, which receives an input clock signal and a control signal.

The monostable circuit generates pulses that form an output clock signal, in particular a square-wave signal, having the same frequency as the input clock signal, and a duty cycle that may be regulated as a function of the control signal (which determines the duration of the pulses of the monostable circuit).

In particular, the control signal for the monostable circuit is generated via a feedback loop, as a function of the detection of the actual duty cycle of the output clock signal and of a reference signal, indicative of the desired value for the same duty cycle.

Figure 1:
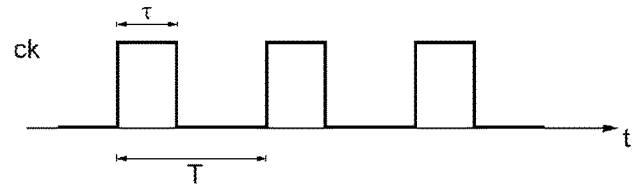
FIG. 1 shows an example of a clock signal and the corresponding duty cycle.
Figure 2:
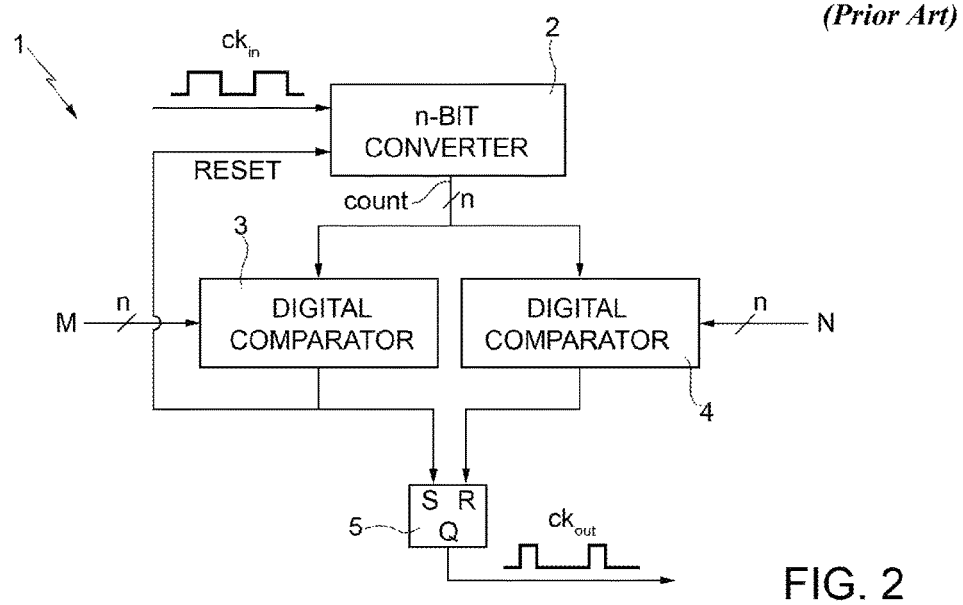
FIG. 2 is a general circuit diagram of a first clock-signal generator circuit, of a known type.
Figure 3:
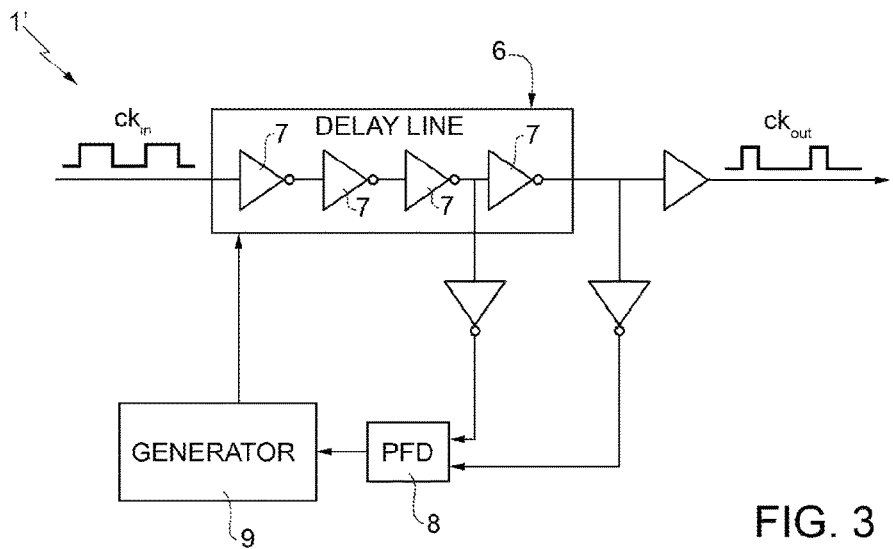
FIG. 3 is a general circuit diagram of a second clock-signal generator circuit, also of a known type.
Figure 4:
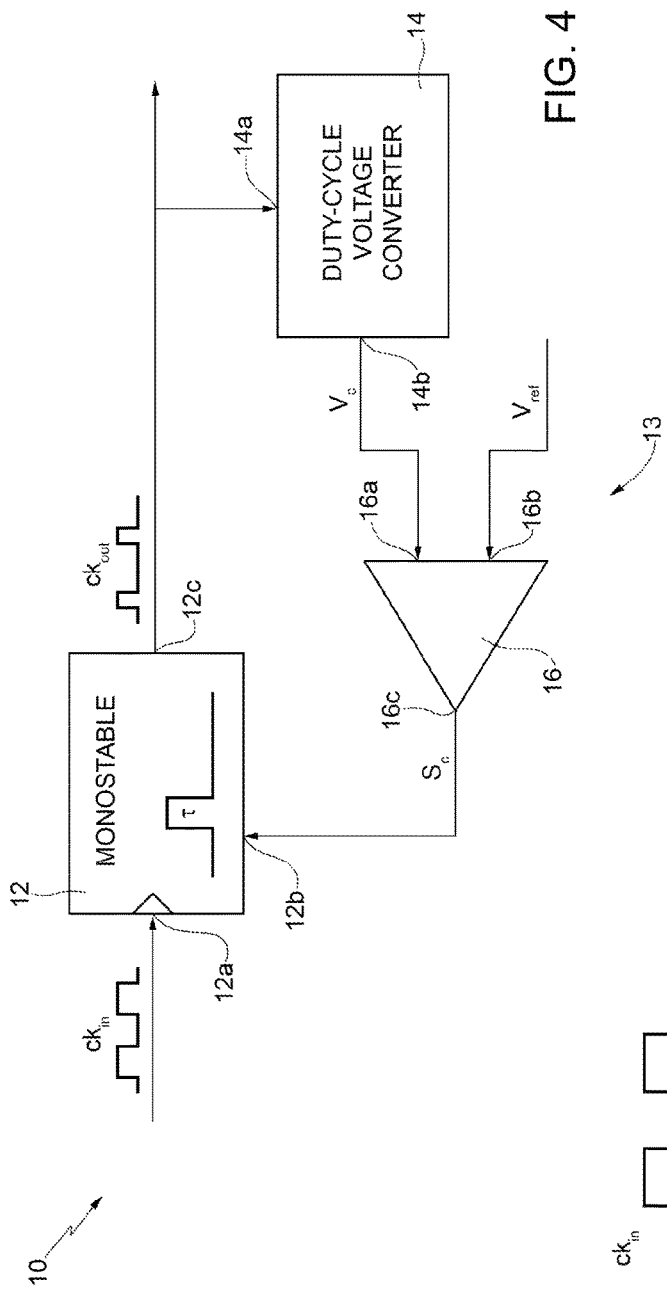
FIG. 4 is a general circuit diagram of a clock-signal generator circuit, according to an embodiment of the present solution.

As illustrated in FIG. 4, a clock-signal generator circuit 10 according to an embodiment of the present disclosure thus comprises a monostable stage 12, having:

a clock input 12a, which receives an input clock signal $ck_{in}$, for example a clock signal having a period T, or else a pulse signal having a given frequency f (f=1/T);

a control input 12b, which receives a control signal $S_c$; and an output 12c, on which an output clock signal $ck_{out}$ is generated.

Figure 5:
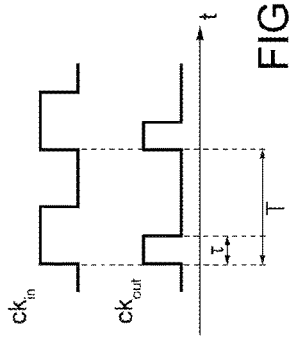
FIG. 5 shows plots of electrical quantities in the circuit of FIG. 4.

In particular, and as shown also in FIG. 5, the monostable stage is configured to generate, at each edge, for example a rising edge, or at each pulse, of the input clock signal $ck_{in}$ a pulse having a duration τ, which is a function of the control signal $S_c$ received on the control input 12b. The output clock signal $ck_{out}$ has the same period/frequency T/f as the input clock signal $ck_{in}$, and a duty cycle d that is variable as a function of the control signal $S_c$.

In other words, the monostable stage 12 is triggered by the edge, for example the rising edge, or by the occurrence of the pulses, of the input clock signal $ck_{in}$.

The monostable stage 12, in a known way that will be evident to a person skilled in the field, may have several circuit embodiments, both as a digital circuit with logic gates (this implementation is advantageous in the case of high values of the frequency f), and as an analog circuit, for example using known RC networks or other integrated circuits (ICs).

For instance, a known solution for the signal-controlled monostable stage 12 is described in the following reference, the entirety of which is incorporated by reference herein: "A Novel Monostable Multivibrator Circuit", P. Tuwanut, J. Koseeyaporn, P. Wardkein, TENCON 2005 IEEE Region 10, pp. 1-4, 21-24, Nov. 2005, Melbourne, Qld.

The clock-signal generator circuit 10 further comprises a feedback loop 13, configured to generate the control signal $S_c$ for the monostable stage 12 as a function of the output clock signal $ck_{out}$ and of a reference signal $V_{ref}$ so that the duty cycle d of the output clock signal $ck_{out}$ has a desired value that depends on the same reference signal $V_{ref}$.

In detail, the feedback loop 13 comprises a converter stage 14, designed for performing a duty-cycle-to-voltage conversion, having an input 14a that is connected to the output 12c of the monostable stage 12 and receives the output clock signal $ck_{out}$, and an output 14b that supplies a converted signal $V_c$, of an analog type, the voltage value of which is a function of (for example, proportional to) the value of duty cycle d of the output clock signal $ck_{out}$.

The converter stage 14, in a known way that will be evident to a person skilled in the field, may have several circuit embodiments; for example (and as will be described hereinafter), it may be made as an analog circuit via an RC network or in general as a lowpass filter.

The feedback loop 13 further comprises an operational-amplifier stage 16, of a differential type (or integrator), having a first input 16a that is connected to the output 14b of the converter stage 14 and receives the converted signal $V_c$, and a second input 16b that receives the reference signal $V_{ref}$, and a respective output 16c that is connected to the control input 12b of the monostable stage 12, on which it supplies the control signal $S_c$.

The operational-amplifier stage 16 is configured to generate the control signal $S_c$, which controls the delay of the monostable stage 12 (i.e., the duration τ of the corresponding pulse signal), starting from the difference, which is appropriately processed (in particular, amplified), between the converted signal $V_c$ and the reference signal $V_{ref}$.

Operation of the feedback loop 13 thus envisages that, in short times, the duty cycle d of the output clock signal $ck_{out}$ (having the same frequency f as the input clock signal $ck_{in}$) goes to the desired value, regulated by the value of the reference signal $V_{ref}$.

The operational-amplifier stage 16, in a known way that will be evident to a person skilled in the field, may be implemented in a number of ways, for example with an integrator configuration that uses a limited number of MOS transistors and has a narrow band so as to have a limited power consumption.

The operational-amplifier stage 16 may define a gain stage with dominant pole at low frequency, having a value such as to stabilize the feedback loop 13 (alternatively, the dominant pole may be obtained by different and further circuit elements).

Figure 6:
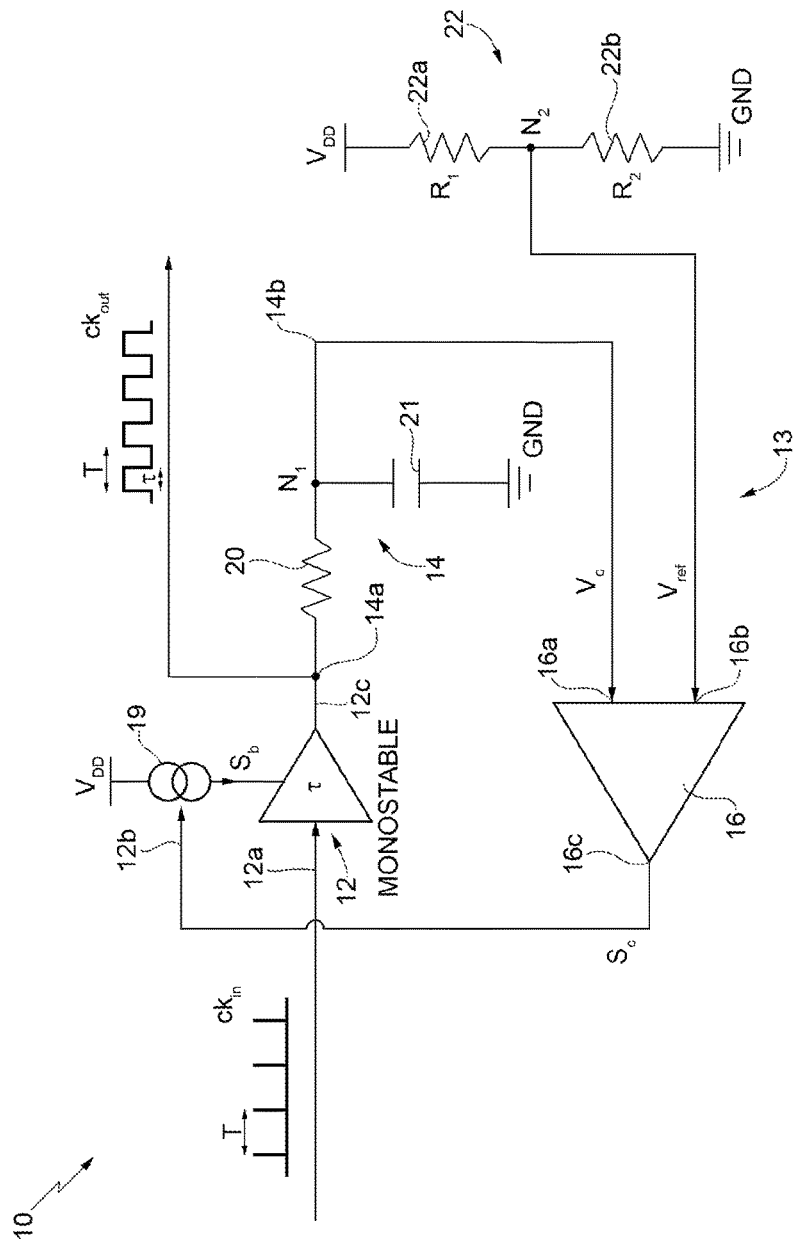
FIG. 6 is a circuit diagram of a possible implementation of the clock-signal generator circuit of FIG. 4.

With reference to FIG. 6, a possible implementation of the clock-signal generator circuit 10 is now described.

In this embodiment, the monostable stage 12 receives, on the clock input 12a, an input clock signal $ck_{in}$ of a pulsed type, at a frequency f, for example 20 MHz, and supplies on the output 12c an output clock signal $ck_{out}$ at the same frequency f, with a duty cycle d, in the example of 50%.

In this case, in the monostable stage 12, the duration τ of the pulses generated is determined by the value of a biasing signal $S_b$, which is generated by a biasing generator 19, starting from a supply voltage $V_{DD}$ supplied to the clock-signal generator circuit 10 on a supply terminal.

The value of the biasing signal $S_b$, and thus of the aforesaid duration τ, is a function of the control signal $S_c$ received on the control input 12b, which in this case controls the biasing generator 19.

Furthermore, the converter stage 14 is in this case obtained by an RC network, formed by a conversion resistor 20, connected between the input 14a (coinciding with the output 12c of the monostable stage 12) and a first internal node $N_1$, and a conversion capacitor 21, connected between the first internal node $N_1$ and a ground reference terminal GND of the clock-signal generator circuit 10.

The control voltage signal $V_c$ is here given by the following expression:

$$V_c = V_{DD} \cdot d.$$

The clock-signal generator circuit 10 further comprises, in this embodiment, a voltage divider 22, formed by a first division resistor 22a, connected between the supply terminal that receives the supply voltage $V_{DD}$ and a second internal node $N_2$, and by a second division resistor 22b, connected between the second internal node $N_2$ and the ground reference terminal GND.

The voltage divider 22 generates, on the second internal node $N_2$, the reference signal $V_{ref}$, in this case given by the following expression:

$$V_{ref} = V_{DD} \frac{R_2}{R_1 + R_2}.$$

In the example, the values of the first and second division resistors 22a, 22b are chosen so that $V_{ref}$ is equal to $V_{DD}/2$, and consequently the duty cycle d is equal to the desired value of 50%.

In an evident manner, it is possible to vary the value of resistance of one or both the division resistors 22a, 22b (advantageously, at least one of the same division resistors 22a, 22b may be an adjustable resistor) for varying continuously the value of the duty cycle d.

As an alternative to the use of the voltage divider 22, the reference signal $V_{ref}$ may be supplied by any other circuit suited for the purpose, such as for example a voltage generator of a bandgap type.

Figure 7A:
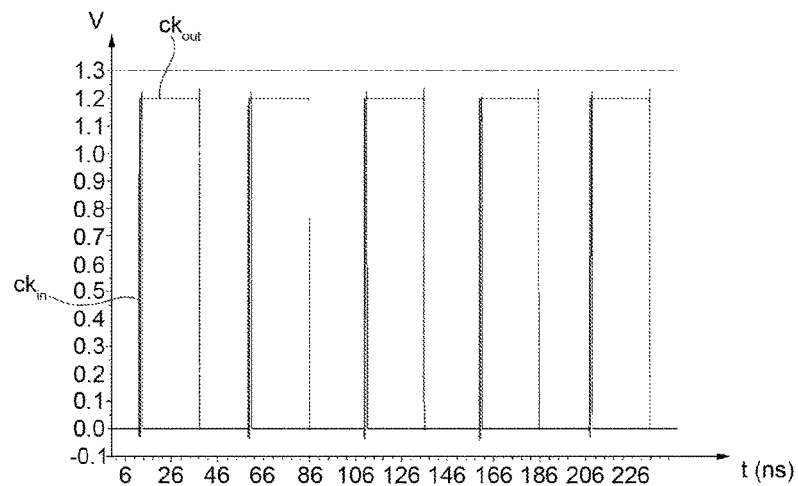
FIGS. 7a and 7b show plots of electrical quantities in the circuit of FIG. 6.

FIG. 7a shows the plots of the input clock signal $ck_{in}$ and of the output clock signal $ck_{out}$, with reference to the embodiment discussed previously and illustrated in FIG. 6.

Figure 7B:
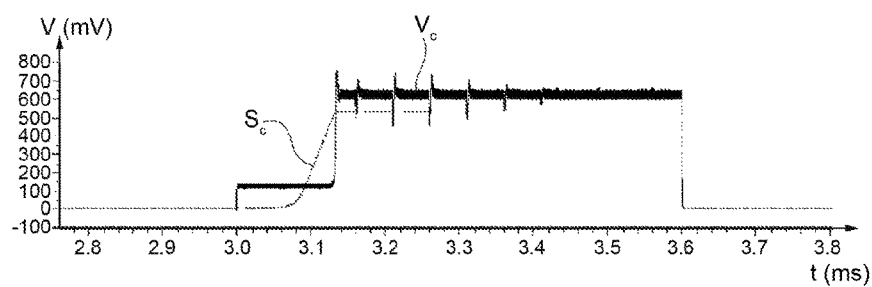

FIG. 7b shows, once again with reference to the same embodiment, the plots of the converted signal $V_c$ and of the control signal $S_c$, which highlight the speed of the feedback loop 13 in bringing the clock-signal generator circuit 10 to the steady-state values, after a short initial transient.

The advantages of the solution described emerge clearly from the foregoing discussion.

In particular, it is emphasized that the above solution enables generation of a clock signal having a duty cycle that may be regulated and selected arbitrarily in a continuous range of values (with amplitude and dynamics depending upon the characteristics of the monostable stage 12 and of the amplifier stage 16), with low complexity and occupation of area and also a low power consumption.

The use of a monostable stage 12 enables an extremely high precision and resolution to be obtained, in general limited only by the noise.

The solution described does not envisage the use of a high-frequency input clock signal $ck_{in}$ (master), given that this frequency coincides with the frequency of the output clock signal $ck_{out}$.

Furthermore, the clock-signal generator circuit 10 may advantageously operate correctly in a wide range of frequencies. For example, as highlighted previously, in the case of high operating frequencies, the monostable stage 12 may envisage an implementation of a logic type, whereas for low frequencies, the monostable stage 12 may envisage an implementation of an analog type.

As discussed with reference, by way of example, to FIG. 6, the clock-signal generator circuit 10 may advantageously supply in a simple and effective way an output clock signal $ck_{out}$ with a duty cycle of 50%, for example by operating on a signal on which it is required to reconstruct or vary the duty-cycle information.

Finally, it is clear that modifications and variations may be made to the various embodiments described and illustrated herein without thereby departing from the scope of the present disclosure.

In particular, it is once again emphasized that numerous circuit implementations may be envisaged for the monostable stage 12, the converter stage 14, and the operational-amplifier stage 16, according to the particular implementation requirements. Furthermore, as previously mentioned, the reference signal $V_{ref}$ may be generated in any known manner.

The clock-signal generator circuit 10 may advantageously be used both for applications of a digital type, for example for synchronization in the communication of logic data, and for applications of an analog type, for example for generation of the phases for operation of switched-capacitor amplifier circuits.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A clock-signal generator circuit, comprising:
a monostable stage having a clock input terminal configured to receive an input clock signal, a control input terminal configured to receive a control signal, and an output terminal configured to provide an output clock signal having a duty cycle that varies as a function of the control signal, the monostable stage being configured to generate, in synchronization with a rising edge or a falling edge of the input clock signal, a pulse in the output clock signal having a duration that is a function of the control signal, and to regulate the pulse duration based on a value of the control signal; and
a feedback loop operatively coupled between the output terminal and the control input terminal of the monostable stage, the feedback loop being configured to receive the output clock signal and to generate the control signal as a function of a detected value and a desired value of the duty cycle of the output clock signal, the feedback loop including a biasing circuit configured to generate the control signal based on a biasing control signal.

2. The circuit according to claim 1, wherein the feedback loop is configured to generate the control signal based on a comparison between a signal indicative of the detected value of the duty cycle of the output clock signal and a reference signal indicative of the desired value of the duty cycle of the output clock signal.

3. The circuit according to claim 2, wherein the feedback loop comprises:
a duty-cycle-to-voltage converter configured to receive the output clock signal and to generate the signal indicative of the detected value of the duty cycle; and
an operational amplifier having a first input terminal configured to receive the signal indicative of the detected value of the duty cycle and a second input terminal configured to receive the reference signal, the operational amplifier being configured to generate the control signal based on a difference between the signal indicative of the detected value of the duty cycle and the reference signal.

4. A clock-signal generator circuit, comprising:
a monostable stage having a clock input terminal configured to receive an input clock signal, a control input terminal configured to receive a control signal, and an output terminal configured to provide an output clock signal having a duty cycle that varies as a function of the control signal; and
a feedback loop operatively coupled between the output terminal and the control input terminal of the monostable stage, the feedback loop being configured to receive the output clock signal and to generate the control signal as a function of a detected value and a desired value of the duty cycle of the output clock signal, the feedback loop being configured to generate the control signal based on a comparison between a signal indicative of the detected value of the duty cycle of the output clock signal and a reference signal indicative of the desired value of the duty cycle of the output clock signal, the feedback loop including:
a duty-cycle-to-voltage converter that includes an RC lowpass filter, the duty-cycle-to-voltage converter being configured to receive the output clock signal and to generate the signal indicative of the detected value of the duty cycle; and
an operational amplifier having a first input terminal configured to receive the signal indicative of the detected value of the duty cycle and a second input terminal configured to receive the reference signal, the operational amplifier being configured to generate the control signal based on a difference between the signal indicative of the detected value of the duty cycle and the reference signal.

5. A clock-signal generator circuit, comprising:
a monostable stage having a clock input terminal configured to receive an input clock signal, a control input terminal configured to receive a control signal, and an output terminal configured to provide an output clock signal having a duty cycle that varies as a function of the control signal; and
a feedback loop operatively coupled between the output terminal and the control input terminal of the monostable stage, the feedback loop being configured to receive the output clock signal and to generate the control signal as a function of a detected value and a desired value of the duty cycle of the output clock signal, the feedback loop being configured to generate the control signal based on a comparison between a signal indicative of the detected value of the duty cycle of the output clock signal and a reference signal indicative of the desired value of the duty cycle of the output clock signal; and
a voltage divider configured to generate the reference signal based on a supply voltage.

6. The circuit according to claim 1, wherein the input clock signal comprises a pulse signal having a frequency, and wherein the output clock signal comprises a square-wave signal having the frequency and a duty cycle of 50%.

7. The circuit according to claim 1, wherein the input clock signal and the output clock signal have a same frequency.

8. A method for generating a clock signal, comprising:
receiving an input clock signal;
receiving a control signal;
generating, based on the input clock signal and the control signal, an output clock signal having a duty cycle that varies as a function of the control signal;
generating, in a feedback loop, the control signal as a function of a detected value and a desired value of the duty cycle of the output clock signal by comparing a signal indicative of the detected value of the duty cycle of the output clock signal with a reference signal indicative of the desired value of the duty cycle of the output clock signal; and
generating the reference signal by a voltage divider coupled to a supply voltage.

9. The method according to claim 8, wherein generating the output clock signal includes generating, in synchronization with a rising edge or a falling edge of the input clock signal, a pulse in the output clock signal having a duration that is a function of the control signal.

10. The method according to claim 8, wherein generating the control signal includes:
receiving, by the feedback loop, the output clock signal;
generating the signal indicative of the detected value of the duty cycle based on the received output clock signal; and
generating the control signal as a function of a difference between the signal indicative of the detected value of the duty cycle and the reference signal.

11. The method according to claim 8, wherein the input clock signal and the output clock signal have a same frequency.

12. A clock signal generation circuit, comprising:
a clock signal generator having an input terminal configured to receive an input clock signal, a control input terminal configured to receive a first control signal, and an output terminal configured to provide an output clock signal having a duty cycle based on the first control signal;
a duty-cycle voltage converter coupled to the output terminal of the clock signal generator and configured to convert the output clock signal into a voltage signal indicating a value of the duty cycle of the output clock signal;
an amplifier having a first input terminal configured to receive the voltage signal from the duty-cycle voltage converter and a second input terminal configured to receive a reference voltage, the amplifier being configured to generate and provide at an output terminal a second control signal based on a difference between the voltage signal and the reference voltage; and
a biasing circuit coupled to the output terminal of the amplifier and to the control input terminal of the clock signal generator, the biasing circuit being configured to generate the first control signal based on the second control signal.

13. The clock signal generation circuit of claim 12, wherein the clock signal generator is configured to generate a pulse in the output clock signal having a duration based on the first control signal.

14. The clock signal generation circuit of claim 13, wherein the clock signal generator is configured to generate the pulse in the output clock signal in synchronization with a rising edge or a falling edge of the input clock signal.

15. The clock signal generation circuit of claim 14, wherein the input clock signal and the output clock signal have a same frequency.

16. The circuit according to claim 4, wherein the input clock signal comprises a pulse signal having a frequency, and wherein the output clock signal comprises a square-wave signal having the frequency and a duty cycle of 50%.

17. The circuit according to claim 4, wherein the input clock signal and the output clock signal have a same frequency.

18. The circuit according to claim 5, wherein the input clock signal comprises a pulse signal having a frequency, and wherein the output clock signal comprises a square-wave signal having the frequency and a duty cycle of 50%.

19. The circuit according to claim 5, wherein the input clock signal and the output clock signal have a same frequency.

\* \* \* \* \*